United States Patent [19]
Hall et al.

[11] Patent Number: 5,387,311
[45] Date of Patent: Feb. 7, 1995

[54] METHOD FOR MANUFACTURING ANTI-FUSE STRUCTURES

[75] Inventors: Stacy W. Hall; Miguel A. Delgado, both of San Antonio, Tex.

[73] Assignee: VLSI Technology, Inc., San Jose, Calif.

[21] Appl. No.: 17,542

[22] Filed: Feb. 16, 1993

[51] Int. Cl.⁶ .......................................... H01L 21/306
[52] U.S. Cl. .................................. 156/630; 156/633; 437/44; 437/922; 148/DIG. 55
[58] Field of Search ............... 156/630, 633; 437/922, 437/44; 148/DIG. 55; 257/529, 530

[56] References Cited

U.S. PATENT DOCUMENTS

| | | | |
|---|---|---|---|
| 4,751,197 | 6/1985 | Wills | 148/DIG. 55 |
| 5,120,679 | 6/1992 | Boardman et al. | 148/DIG. 55 |
| 5,208,177 | 5/1993 | Lee | 437/922 |

FOREIGN PATENT DOCUMENTS

| | | |
|---|---|---|
| WO92/20095 | 11/1992 | European Pat. Off. |
| 0010596 | 5/1980 | Germany . |
| 60-24050 | 2/1985 | Japan ............. 148/DIG. 55 |

*Primary Examiner*—Brian E. Hearn
*Assistant Examiner*—Kevin M. Picardat
*Attorney, Agent, or Firm*—Hickman & Beyer

[57] ABSTRACT

A method for removing excess spacer material in the link vias and open areas of an anti-fuse structure without thinning the anti-fuse layer in the vias by overetching. In an anti-fuse structure, a spacer layer is deposited on an anti-fuse layer where vias in the structure cause a thinner layer of spacer material to be deposited in the vias. A first etch of the spacer layer is accomplished to provide protective spacers in the vias. The etch completely removes the thinner section of the spacer material between the spacers in the vias without overetch, while some spacer material portions remain on the other, open areas of the anti-fuse structure. Designated fuse vias are masked and a second etch of the leftover spacer material is accomplished. This method removes excess spacer material from link vias and other areas around the fuse vias and prevents the anti-fuse layer in the fuse vias from thinning from overetching procedures.

10 Claims, 4 Drawing Sheets

METHOD FOR MANUFACTURING ANTI-FUSE STRUCTURES

BACKGROUND OF THE INVENTION

1. Field of the Invention

This invention relates to integrated circuits, and more particularly to anti-fuse structures for programmable integrated circuits.

2. Background of the Related Art

Programmable integrated circuits include such devices as field-programmable gate arrays and programmable read-only memories (PROMS). Such devices include elements such as anti-fuses to enable them to be programmed.

Field programmable gate arrays include a large number of logic elements, such as AND gates and OR gates, which can be selectively coupled together by devices like anti-fuses to perform user-designed functions. The several types of PROMS, including standard, write-once PROMS, erasable programmable read-only memories (EPROMS), electrically erasable programmable read-only memories (EEPROMS), etc., usually comprise an array of memory cells arranged in rows and columns which can be programmed to store user data. An unprogrammed anti-fuse gate array or PROM is programmed by causing selected anti-fuses to become conductive.

Anti-fuses include a material which initially has a high resistance but which can be converted into a low resistance material by the application of a programming voltage. For example, amorphous silicon, which has an intrinsic resistivity of approximately 1 megohms-cm, can be fashioned into 1 micron wide vias having a resistance of approximately 1-2 gigohms. These vias can then be melted and recrystallized by the application of a voltage in the range of 10-12 volts d.c. to form vias having a resistance less than 200 ohms. These low resistance vias can couple together logic elements of a field programmable gate array so that the gate array will perform user-defined functions, or can serve as memory cells of a PROM.

An anti-fuse device is typically formed on a semiconductor wafer by first providing a first conductive layer, a first insulating layer, a second conductive layer, and a second insulating layer, each layer on top of the previous. Typically, two types of holes or vias are formed in the second insulating layer: fuse vias and link vias. Fuse vias include an anti-fuse layer and are programmed with voltages to provide the user-defined functions or memory cells as described above. Link vias are formed to provide a link to the second conductive layer, and thus do not include an anti-fuse layer.

Anti-fuses are formed within fuse vias by first depositing anti-fuse material on the insulating layer. Next, unwanted anti-fuse material is removed from the link vias and the open areas surrounding the vias. A mask material is deposited on the anti-fuse material in the fuse vias and the uncovered anti-fuse material is subjected to an etching process. The result is an anti-fuse layer provided within the fuse vias and no anti-fuse material in the link vias or open areas of the device. Finally, a third conductive layer is deposited in the fuse vias to provide a means of programming the anti-fuse material and in the link via to provide a contact to the second conductive layer.

A problem with anti-fuses is that the anti-fuse material in the fuse vias tends to have imperfections or creases known as "cusps". These cusps are weak points in the anti-fuse material and can result in the failure of the anti-fuse structure or cause the anti-fuse to be programmed by a lower programming voltage than the desired voltage.

A solution to the cusps in the anti-fuse material is to deposit a spacer layer made of an insulating material on top of the anti-fuse layer and to etch the spacer layer to form protective spacers within the vias that cover the cusps. The spacers prevent a lower programming voltage from accidentally making an anti-fuse conductive at the cusps.

The prior art has addressed the problem of cusps. In U.S. Pat. No. 5,120,679 by Boardman et al., an anti-fuse structure is disclosed in which oxide spacers are deposited within and line the walls of anti-fuse vias to prevent failure of the anti-fuse and to prevent undesired programming voltages from programming the anti-fuse. The disclosure of U.S. patent application Ser. No. 5,120,679, which is assigned to the assignee of the present invention, is hereby incorporated by reference herein in its entirety.

A problem with the use of spacers on the anti-fuse material is shown in FIG. 1. The anti-fuse device 10 includes fuse vias 12 and a link via 14. Anti-fuse material 16 is included in the fuse vias 12 but has been etched away from the link via 14 and the open areas 18 of the device. Insulating spacers 20 are provided in the fuse vias 12, where they are required to protect the cusps 22. However, spacers 24 or "dog ears" also are present in the link via 14, where they are unwanted. These spacers 24 interfere with the conductive layer that is later deposited on the vias, resulting in a poor electrical contact with the conductive layer 25.

A further problem with the use of spacers is shown in FIG. 2, which shows a via structure after the spacer layer 26 has been deposited using a typical deposition process. The spacer layer has a thickness of d1 in the via and a thickness of d2 on the open surfaces of the wafer. To form the spacers in the via, the spacer layer must be etched, and this spacer etch clears the thinner spacer material 28 in the via before the spacer material on the open areas 29. The spacer layer of thickness d2 must be completely etched away so that the following anti-fuse layer etch can be accomplished; if the spacer layer is etched only to the level d1, the leftover spacer material on the open areas 29 will interfere with the sensitive anti-fuse layer etch. However, by etching the entire thickness d2, a portion of the anti-fuse layer 16 in the via is also etched. The anti-fuse layer in the via has a thickness d3 before the spacer etch, and a thickness d4 after the spacer etch. This thinning of the anti-fuse layer is undesirable since, as a result, the programming voltage of the anti-fuse is lowered.

The method disclosed in the Boardman et al. patent provides for removing unwanted spacer material from areas outside the anti-fuse via locations, such as against vertical surfaces of the anti-fuse structure. The patent discloses using a second etch process before or after the anti-fuse material etch. However, the method in this patent does not present a solution for the thinning of the anti-fuse layer resulting from overetching the spacer layer in the via, as described above. The method in the patent presumably uses this prior art method of overetching the spacer layer to prevent excess oxide material from interfering with the anti-fuse layer etch, resulting in a lower, unpredictable programming voltage.

What is needed is a method that allows the use of insulating spacers in anti-fuse vias while substantially eliminating the problem of thinning of the anti-fuse layer in the fuse vias due to overetch of the spacer layer, thereby preventing a lower, undesired programming voltage of the anti-fuse.

SUMMARY OF INVENTION

The present invention addresses the problems in the prior art by providing a method to etch unwanted insulating spacer material in link vias and open areas of an anti-fuse structure while preventing thinning of the anti-fuse material in fuse vias due to overetch. A first spacer material etch of the thickness of the anti-fuse material in the vias is first completed, and a second spacer etch to remove the leftover spacers in the link vias and the excess spacer material left on the open areas of the wafer is then accomplished.

The method comprises a formation of an anti-fuse structure on a wafer as in the prior art up to the step of etching the insulating spacer layer. The spacer layer is etched to the thickness of the spacer layer in the vias, leaving a small layer portion of spacer material on the open areas of the wafer. A resist layer is next deposited on the fuse vias. Then, the spacer material is subjected to a second etch to remove the unwanted spacers in the link vias and the small leftover spacer layer left on the open areas of the wafer. After this second spacer etch, the anti-fuse layer is etched normally.

The second spacer etch can be accomplished using an isotropic etch procedure, such as a wet etch, or an anisotropic etch procedure, such as a plasma etch.

The present invention eliminates unwanted spacers that form within the link vias as a part of the two-part etching process. These spacers tend to interfere with the electrical contact of the topmost conductive layer and the conductive layer just underneath the vias.

The present invention has the advantage of substantially eliminating the etching problems associated with different thicknesses of spacer layer in the vias and the open areas of the anti-fuse structure. The problem of overetching the spacer layer to remove excess oxide material, resulting in thinning of the anti-fuse layer in the fuse vias, is eliminated. The problems of low, unwanted programming voltages for the anti-fuses are thus reduced with the present invention.

This and other advantages of the present invention will become apparent to those skilled in the art after reading the following descriptions and studying the various figures of the drawings.

DETAILED DESCRIPTION OF THE PREFERRED EMBODIMENTS

Figure 1:
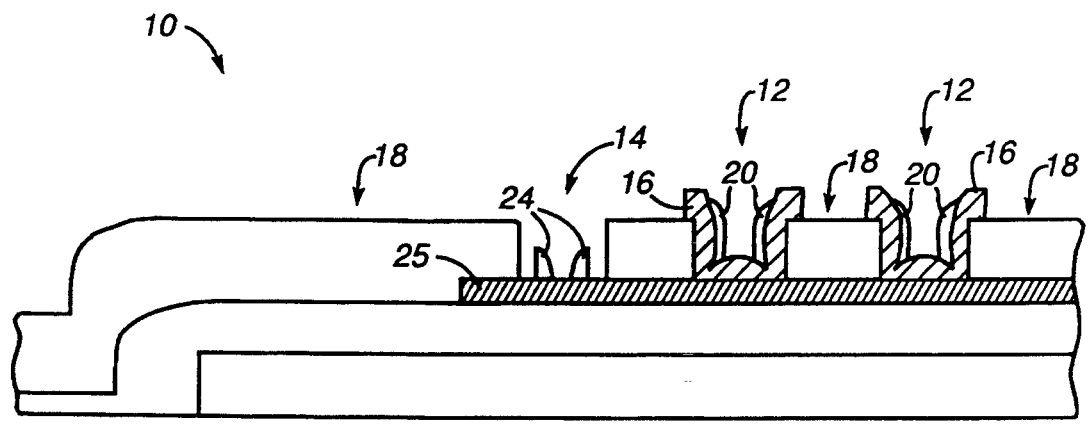
FIG. 1 is a side cross-sectional view of an anti-fuse structure of the prior art.
Figure 2:
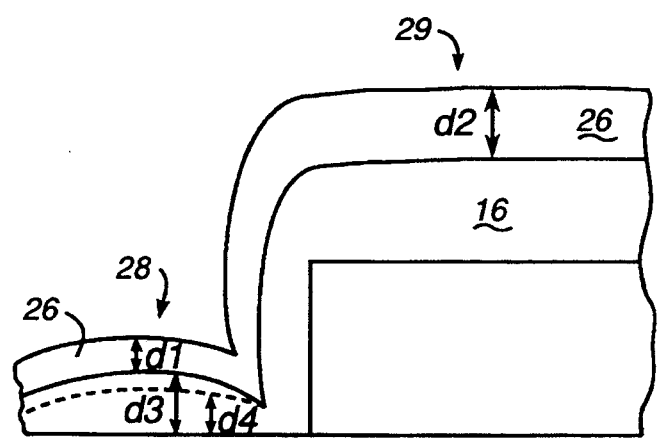
FIG. 2 is a detailed cross-sectional view of the prior art insulating layer, anti-fuse layer, and spacer layer before etching the spacer layer.
Figure 3:
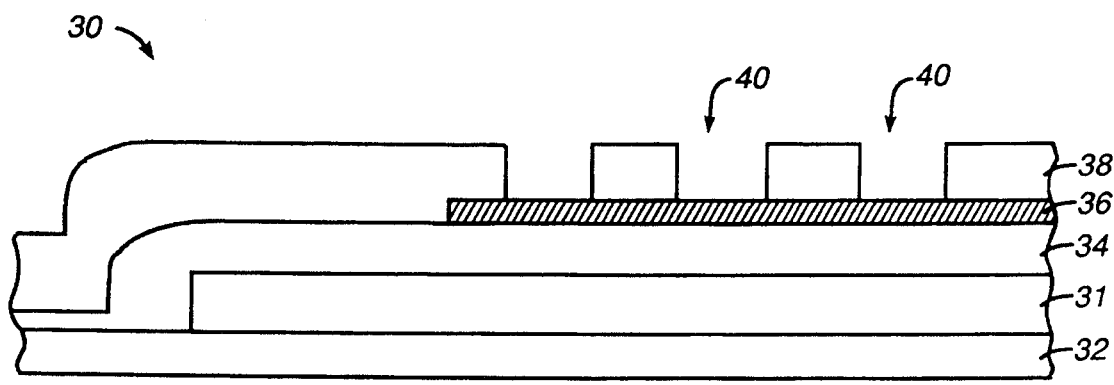
FIG. 3 is a side cross-sectional view of the anti-fuse structure of the present invention prior to the deposition of the anti-fuse layer.

In FIGS. 1 and 2, prior art anti-fuse structures are shown. In FIG. 3, an early step in the formation of an anti-fuse structure of the present invention is shown. An anti-fuse structure 30 comprises a conductive layer 31 is deposited upon a substrate 32. The substrate is preferably a semiconductor grade silicon wafer. The conductive layer 31 is typically made of a metal such as Aluminum and usually has a thickness of about 4000 angstroms (Å). The conductive layer 31 is preferably deposited by a sputter deposition system, which is commercially available from such companies as Varian, Inc. of Palo Alto, Calif. and Applied Materials, Inc. of Santa Clara, Calif. The conductive layer 31 is then patterned by a photolithography process to form interconnect lines according the structure of the device, such as a memory circuit. Such patterning is well-known in the art.

An inter-metal oxide (IMO) layer 34, made of a material such as silicon dioxide, is deposited upon the first conductive layer 31, and usually has a thickness of about 6000 Å. This layer is preferably provided by a commercially available chemical vapor deposition system available from such companies as Novellus, Inc. of San Jose, Calif. and Applied Materials, Inc. A second conductive layer 36 is then deposited on the IMO layer 34; layer 36 is preferably made of a material such as titanium-tungsten (TiW) and has a typical thickness of about 2200 Å. The advantages of using TiW include minimal diffusion into silicon and providing a very smooth surface. The conductive layer 36 can then be patterned to form conductive lines similar to conductive layer 31.

A second insulating layer 38 is deposited on the conductive layer 36 at a thickness of about 3000 Å. This layer is preferably made of an oxide material, such as silicon dioxide, or a similar insulating material. Vias 40 are etched in the insulating layer 38 down to conductive layer 36 using standard techniques. A slight overetch into conductive layer 36 is allowable, but, so that the anti-fuse structures function predictably, the overetch should be limited to 500 Å or less.

Figure 4:
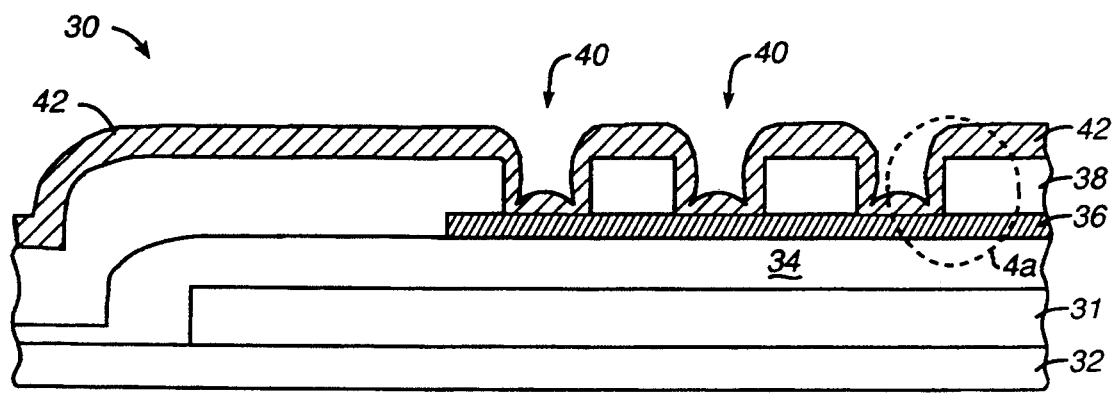
FIG. 4 is a side cross-sectional view of the anti-fuse structure of the present invention after the anti-fuse layer has been deposited.

FIG. 4 shows the next step in the formation of the anti-fuse structure. Anti-fuse layer 42 is deposited on the insulating layer 38 substantially conformally so that the layer generally assumes the contours of the vias 40. The thickness of the anti-fuse material is about 1650 Å; this thickness must be precisely controlled, with little deviation. A typical material used for an anti-fuse layer is amorphous silicon (A-Si), which can be deposited within a plasma enhanced chemical vapor deposition (PECVD) system such as the Precision 5000 CVD system from Applied Materials, Inc.

Figure 4A:
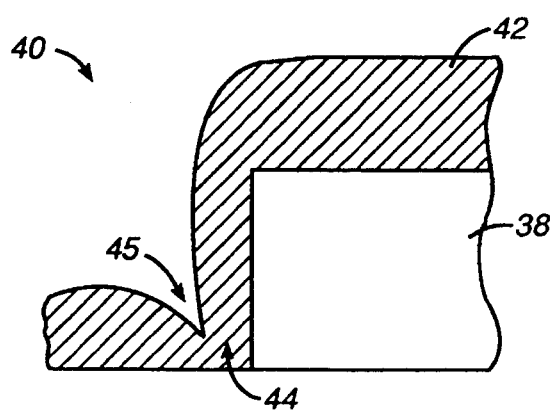
FIG. 4a is a detailed cross-sectional view of a portion of a fuse via of FIG. 4.

FIG. 4a shows a detailed view of a via 40 that has been deposited with an anti-fuse layer 42. Due to the deposition process, the sidewalls of the via have prevented the anti-fuse material from fully covering the areas 44 close to the sidewalls. Cusps 45 are the result of an incomplete deposition on areas 44, where the anti-fuse layer 42 is thinner. Since the layer 42 is thinner in these areas, a low programming voltage can accidentally cause the anti-fuse to become conductive. Similarly, the conductive material that is applied after the anti-fuse material (described below) can spike through the thinner areas of the anti-fuse material at the cusps. The cusps also create unpredictability as to which anti-fuses formed on a wafer will function correctly.

Figure 5:
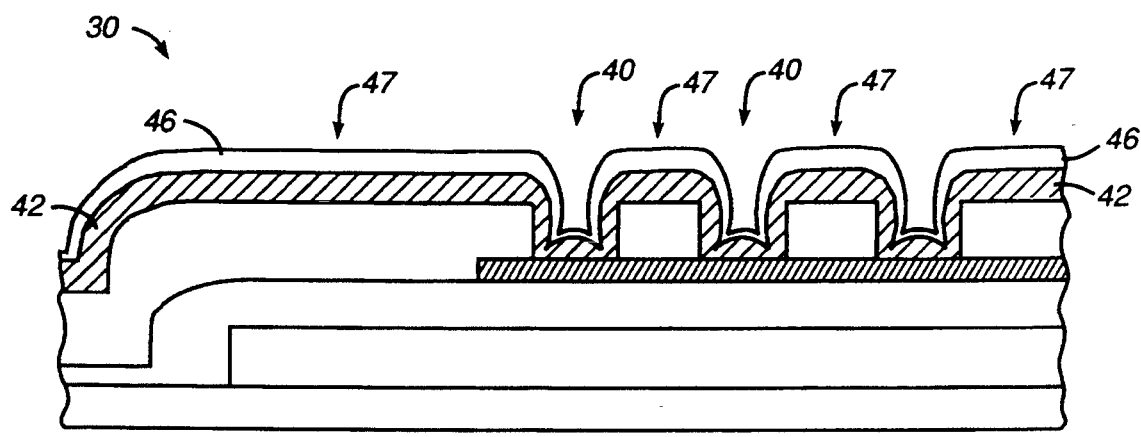
FIG. 5 is a side cross-sectional view of the anti-fuse structure of the present invention after the spacer layer has been deposited.

FIG. 5 shows the next step in a solution to the cusping problem, which is the formation of spacers against the sidewalls of the vias and over the cusps in the anti-fuse layer. Such spacers can prevent a low voltage from programming the anti-fuse. Spacer layer 46 is first deposited on the anti-fuse material layer 42. The spacer layer material is an insulating material, such as silicon dioxide, and is typically about 2000 Å thick. Due to the deposition process and the structure of the via holes, the thickness of the spacer layer in the vias 40 tends to be thinner than the thickness of the spacer layer on the open areas 47 outside the vias; at the cusps, these two thicknesses can differ by as much as 40%. For example, if the thickness of the spacer layer in the open areas 47 is about 1720 Å, the thickness of the spacer layer at the cusps in the via 40 will be about 1150 Å, and about 1500 Å at the midpoint of the via).

Figure 6:
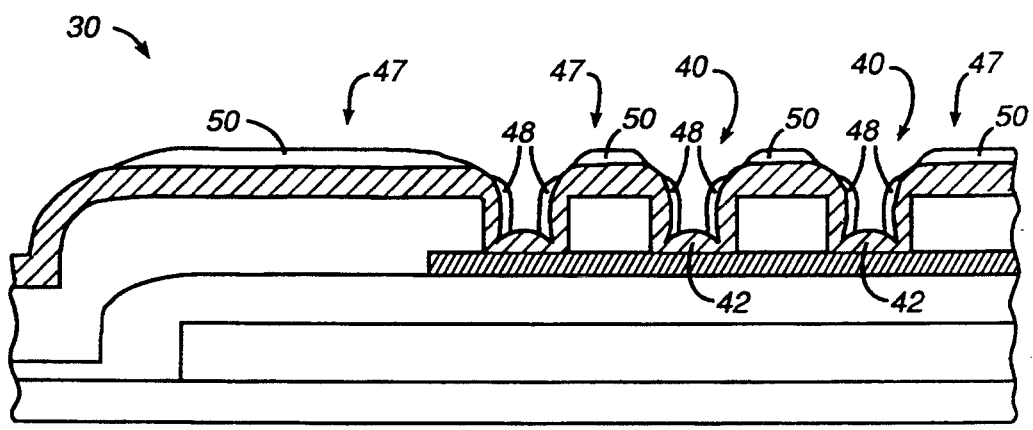
FIG. 6 is a side cross-sectional view of the anti-fuse structure of the present invention after the spacer layer has been etched to form spacers.

In FIG. 6, a first etch of the spacer layer 46 has been completed to form spacers 48 in the vias. The spacer etch is preferably accomplished using an anisotropic etch, such as a plasma etch using gasses such as CHF$_3$ and C$_2$F$_6$. This first etch is timed so that the spacer layer is etched to the thickness of the layer in the vias 40, i.e. about 1500 Å in this example. It is desirable that there be little or no overetch of the oxide in the vias 40, since the anti-fuse layer 42 in the vias are preferably not etched or thinned by any appreciable amount. Substantial thinning of the layer 42 can cause unpredictability in the anti-fuses and lower anti-fuse programming voltages to an undesired level.

By etching the spacer layer 46 to the thickness of the layer inside the vias 40, a small portion 50 of spacer material is left on the open areas 47 of the anti-fuse structure, i.e. about 220 Å in this example. This is due, of course, to the fact that the thickness of the spacer layer at these open areas is greater than the thickness of the spacer layer in the vias.

Figure 7:
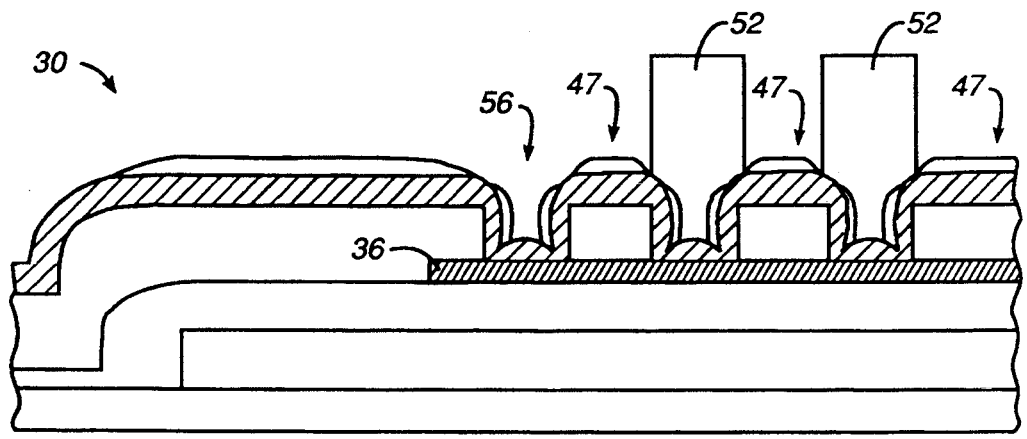
FIG. 7 is a side cross-sectional view of the anti-fuse structure of the present invention after a resist layer has been deposited over the fuse vias.

FIG. 7 shows the next step in the process, which is to deposit a mask layer 52 over designated fuse vias 54 of the anti-fuse structure to mask these vias from the anti-fuse etch. The mask layer is typically made from photoresist. The mask layer covers the fuse via portion, and may extend onto some of the open areas 47 of the anti-fuse structure. The fuse vias 54 are designated to be anti-fuses, while the remaining vias 56 are designated to be link vias to provide a connection between conductive layer 36 and a later-deposited conductive layer (described below).

Figure 8:
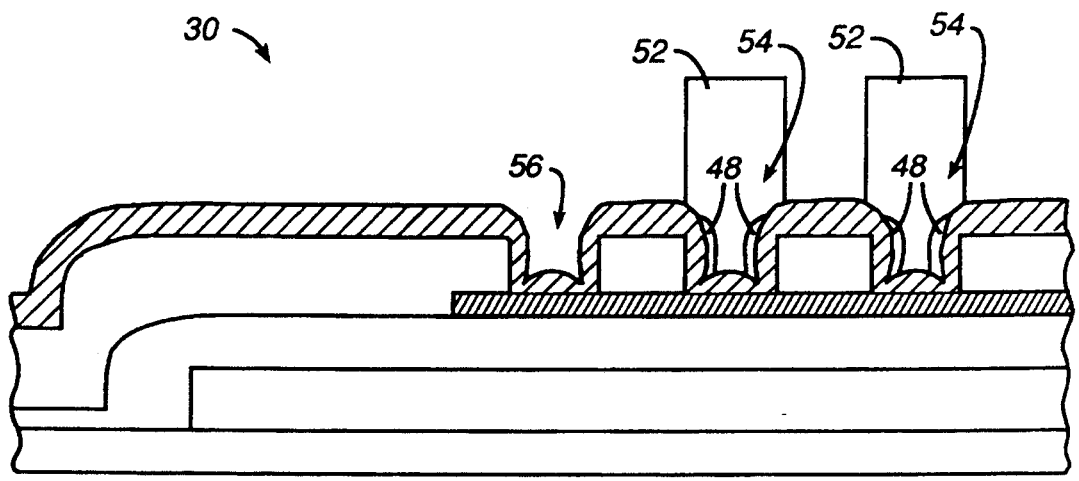
FIG. 8 is a side cross-sectional view of the anti-fuse structure of the present invention after the second spacer etch has been completed.

In FIG. 8, the next step of the process has been completed, which is a second spacer layer etch. The small portions 50 of spacer material on open areas 47 that were left from the first spacer layer etch (in FIG. 6) tend to interfere with the anti-fuse layer etch. Also, the spacers 48 left in the link via 56 are unwanted in the link via, since no anti-fuse layer exists there. Therefore, the second spacer material etch is performed to remove the remaining materials both at the open areas 47 and in the link via 56. This second etch is preferably accomplished using a plasma isotropic etch process or an extended anisotropic etch process until all desired material is removed. An isotropic etch using a liquid etchant, such as HF, can also be used, but such a process tends to undercut the material covering the cusps. An example of a suitable HF isotropic etch process is disclosed in U.S. Pat. No. 5,120,679, assigned to the assignee of the present application and hereby incorporated herein by reference in its entirety. The spacers 48 in the fuse vias 54 are unaffected due to the resist layer 52 protecting the fuse vias.

Figure 9:
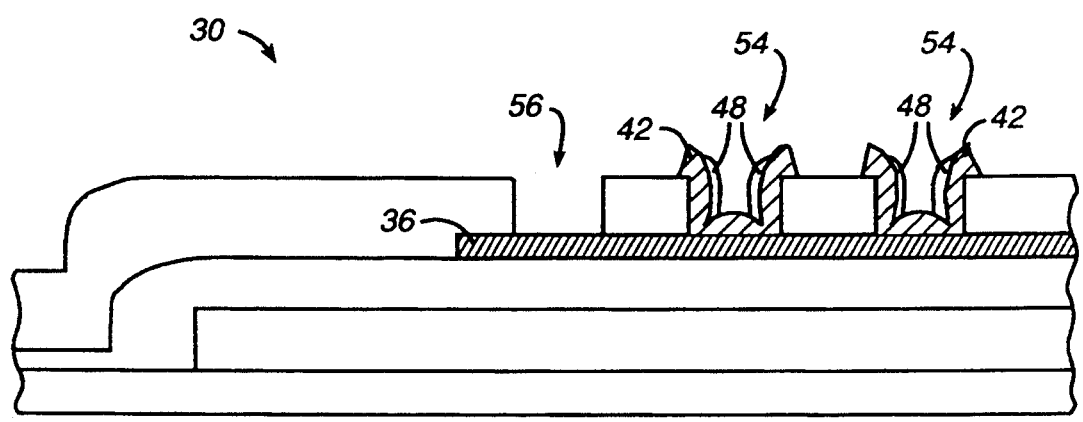
FIG. 9 is a side cross-sectional view of the anti-fuse structure of the present invention after the anti-fuse layer has been etched and the resist layer removed.

In FIG. 9, the anti-fuse layer etch has been completed and the resist layer 52 has been removed. The anti-fuse material etch is typically accomplished using a plasma poly etch. Fuse vias 54 include the anti-fuse layer 42 deposited within them and spacers 48 formed over the cusps in the anti-fuse layer. Link via 56 is clear of any extra spacer material, allowing a clean connection from conductive layer 36 to a conductive layer deposited over the link via.

After the anti-fuse material etch, a conductive layer (not shown) is typically deposited over the anti-fuse structure. This conductive material is deposited into the fuse and link vias and is typically made of titanium tungsten or similar materials. Since no unwanted spacer material is left in the link via, the conductive layer makes excellent contact with the conductive layer 36.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A method for forming a plurality of anti-fuse structures comprising:

providing a conductive substrate;

depositing an oxide layer over said conductive substrate;

providing a plurality of via holes through said oxide layer to said conductive substrate, wherein at least one of said vias is a link via;

depositing an anti-fuse material over said oxide layer and within said vias;

depositing spacer material over said anti-fuse material;

performing a first etch process to provide spacers within said vias such that spacer material is essentially removed over said anti-fuse material between said spacers but extraneous material remains at least partially on said anti-fuse material on surfaces outside said vias such that spacer material is not overetched in said vias, whereby said anti-fuse material in said vias is not thinned and an anti-fuse programming voltage associated with each of said vias is not reduced;

masking a plurality of vias designated as anti-fuse vias;

performing a second etch process to remove said extraneous material from areas not designated as anti-fuse vias.

2. A method as recited in claim 1 wherein said conductive substrate comprises titanium tungsten.

3. A method as recited in claim 2 further comprising providing an insulating layer below said conductive substrate.

4. A method as recited in claim 3 wherein said oxide layer comprises silicon dioxide.

5. A method as recited in claim 4 wherein said oxide layer has a thickness of about 3000 angstroms.

6. A method as recited in claim 1 wherein said anti-fuse material comprises amorphous silicon.

7. A method as recited in claim 6 wherein said step of depositing said spacer material over said anti-fuse material includes depositing said spacer material to a thickness of about 2000 angstroms.

8. A method as recited in claim 6 wherein said spacer material comprises silicon dioxide.

9. A method as recited in claim 8 wherein said second etch process is an isotropic etch process.

10. A method as recited in claim 8 wherein said second etch process is an anisotropic etch process.

* * * * *